United States Patent
Sano et al.

(10) Patent No.: US 10,811,108 B2
(45) Date of Patent: Oct. 20, 2020

(54) SEMICONDUCTOR MEMORY DEVICE AND MEMORY SYSTEM

(71) Applicant: TOSHIBA MEMORY CORPORATION, Minato-ku (JP)

(72) Inventors: Yuuta Sano, Yokosuka (JP); Junichi Sato, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/537,023

(22) Filed: Aug. 9, 2019

(65) Prior Publication Data

US 2020/0185043 A1   Jun. 11, 2020

(30) Foreign Application Priority Data

Dec. 7, 2018  (JP) ................................ 2018-229670

(51) Int. Cl.

| G11C 16/32 | (2006.01) |
| G06F 13/12 | (2006.01) |
| G11C 16/26 | (2006.01) |
| G11C 16/04 | (2006.01) |

(52) U.S. Cl.
CPC .............. *G11C 16/32* (2013.01); *G06F 13/12* (2013.01); *G11C 16/26* (2013.01); *G11C 16/0483* (2013.01)

(58) Field of Classification Search
CPC ..... G11C 16/32; G11C 16/26; G11C 16/0483; G06F 13/12
See application file for complete search history.

(56) References Cited

U.S. PATENT DOCUMENTS

| 9,396,775 B2 | 7/2016 | Shirakawa et al. |
| 10,157,152 B2 | 12/2018 | Park et al. |
| 2015/0234746 A1 | 8/2015 | Jo |
| 2018/0089087 A1 | 3/2018 | Chang et al. |

FOREIGN PATENT DOCUMENTS

JP   2015-176309 A   10/2015

*Primary Examiner* — Sultana Begum
(74) *Attorney, Agent, or Firm* — Oblon, McClelland, Maier & Neustadt, L.L.P.

(57) ABSTRACT

A semiconductor memory device includes: a memory cell array; a peripheral circuit connected to this memory cell array, the peripheral circuit outputting data in the memory cell array as a read data in response to input of a command set, the command set including a first command, address data, and a second command; a first electrode capable of being used in input of the command set and output of the read data; and a second electrode capable of supplying electric power to the peripheral circuit. A current flowing in the second electrode at a second timing is larger than a current flowing in the second electrode at a first timing, the first timing being a timing at which the first command is inputted, the second timing being a timing before which the input of the address data is started and after which an input of the second command is finished.

7 Claims, 12 Drawing Sheets

FIG. 14

|  | Bit7 | Bit6 | Bit5 | Bit4 | Bit3 | Bit2 | Bit1 | Bit0 |
|---|---|---|---|---|---|---|---|---|
| A501 | COL3 | COL2 | COL1 | COL0 | CHP2 | CHP1 | CHP0 | FLG1 |
| A502 | Col7 | Col6 | Col5 | Col4 | Col3 | Col2 | Col1 | FLG0 |
| A001 | Col7 | Col6 | Col5 | Col4 | Col3 | Col2 | Col1 | Col0 |
| A002 | Col12 | Col11 | Col10 | Col9 | Col8 |  |  |  |

SEMICONDUCTOR MEMORY DEVICE AND MEMORY SYSTEM

CROSS-REFERENCE TO RELATED APPLICATIONS

This application is based upon and claims the benefit of Japanese Patent Application No. 2018-229670, filed on Dec. 7, 2018, the entire contents of which are incorporated herein by reference.

FIELD

The present embodiment relates to a semiconductor memory device and a memory system.

BACKGROUND

Description of the Related Art

There is known a semiconductor memory device that includes: a memory cell array including a plurality of memory cells; a peripheral circuit connected to the memory cell array, the peripheral circuit outputting data stored in the memory cell array as a read data in response to input of a command set, the command set including commands and address data; a first electrode capable of being used in input of the command set and output of the read data; and a second electrode capable of supplying electric power to the peripheral circuit.

BRIEF DESCRIPTION OF THE DRAWINGS

FIG. 14 is a view for explaining data A501, A502 according to same embodiment.

DETAILED DESCRIPTION

Figure 1:
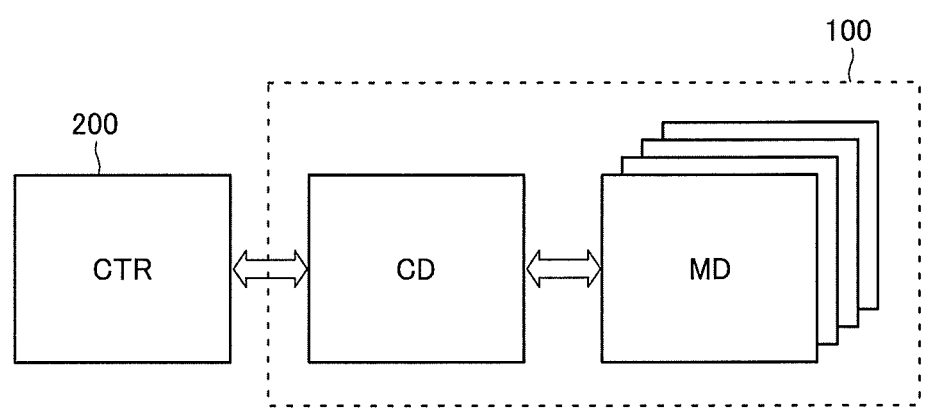
FIG. 1 is a schematic block diagram showing a configuration of a memory system 100 according to a first embodiment.

A semiconductor memory device according to an embodiment includes: a memory cell array including a plurality of memory cells; a peripheral circuit connected to the memory cell array, the peripheral circuit outputting data stored in the memory cell array as a read data in response to input of a command set, a first electrode capable of being used in input of the command set and output of the read data; and a second electrode capable of supplying electric power to the peripheral circuit. The command set includes a first command, address data inputted after an input of the first command, and a second command inputted after an input of the address data. A current flowing in the second electrode at a second timing is larger than a current flowing in the second electrode at a first timing. The first timing is a timing at which the first command is inputted. The second timing is a timing before which the input of the address data is started and after which an input of the second command is finished.

A semiconductor memory device according to an embodiment includes: a memory cell array including a plurality of memory cells; a peripheral circuit connected to the memory cell array, the peripheral circuit outputting data stored in the memory cell array as a read data in response to input of a command set; a first electrode capable of being used in input of the command set and output of the read data; and a second electrode capable of supplying electric power to the peripheral circuit. The command set includes a first command, address data inputted after an input of the first command and including a flag information, and a second command inputted after an input of the address data. In case that the flag information is a first value, a first current flows in the second electrode at a first timing at which the first command is inputted, a second current flows in the second electrode at a second timing before which the input of the first command is finished and after which an input of the second command is finished, and a third current flows in the second electrode at a third timing before which the input of the second command is finished. In case that the flag information is a second value, a fourth current flows in the second electrode at the first timing, a fifth current flows in the second electrode at the second timing, and a sixth current flows in the second electrode at the third timing. Additionally, the third current, the fifth current, and the sixth current are larger than the first current, the second current, and the fourth current.

A semiconductor memory device according to an embodiment includes: a plurality of memory chips. Each of the plurality of memory chips comprises: a memory cell array including a plurality of memory cells; a peripheral circuit connected to the memory cell array, the peripheral circuit outputting data stored in the memory cell array as a read data in response to input of a command set; a first electrode capable of being used in input of the command set and output of the read data; and a second electrode capable of supplying electric power to the peripheral circuit. The command set includes a first command, address data inputted after an input of the first command and including a flag information, and a second command inputted after an input of the address data. The plurality of memory chips includes a first memory chip and a second memory chip. At a first timing at which the first command is inputted to the first memory chip and the second memory chip, a first current flows in the second electrode of the first memory chip, and a second current flows in the second electrode of the second memory chip. At a second timing before which the input of the address data is started and after which the input of the address data is finished, a third current flows in the second electrode of the first memory chip, and a fourth current flows in the second electrode of the second memory chip. At a third timing before which the input of the address data is finished and after which the input of the second command is started, a fifth current flows in the second electrode of the first memory chip, and a sixth current flows in the second electrode of the second memory chip. Additionally, the third current, the fourth current, and the fifth current are larger than the first current, the second current, and the sixth current.

Next, semiconductor memory devices according to embodiments will be described in detail with reference to the drawings. Note that the embodiments below are merely examples, and are not shown with the intention of limiting the present invention.

Moreover, when a "semiconductor memory device" is referred to in the present specification, it sometimes means a memory die, and sometimes means a memory system including a control die, such as a memory chip, a memory card, or an SSD. Furthermore, it sometimes means a configuration including a host computer, such as a smartphone, a tablet device, or a personal computer. Additionally, when a "chip" is referred to in the present specification, it sometimes means a memory die divided by means such as dicing, and sometimes means a package including such memory die and a control chip.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been directly connected, the second transistor is in an OFF state, the first transistor is "electrically connected" to the third transistor.

Moreover, in the present specification, when a circuit, or the like, is said to "electrically conduct" two wirings, or the like, this sometimes means, for example, that this circuit, or the like, includes a transistor, or the like, that this transistor, or the like, is provided in a current path between the two wirings, and that this transistor, or the like, is in an ON state.

First Embodiment

[Memory System 100]

FIG. 1 is a schematic block diagram showing a configuration of a memory system 100 according to a first embodiment.

The memory system 100 performs the likes of read, write, and erase of user data, according to a signal transmitted from a host computer 200. The memory system 100 is, for example, a memory chip, a memory card, an SSD, or another system capable of storing user data. The memory system 100 includes: a plurality of memory dies MD storing user data; and a control die CD connected to these plurality of memory dies MD and the host computer 200. The control die CD includes the likes of a processor, a RAM, and a ROM, for example, and performs processing such as conversion of a logical address and a physical address, bit error detection/correction, wear leveling, and so on.

Figure 2:
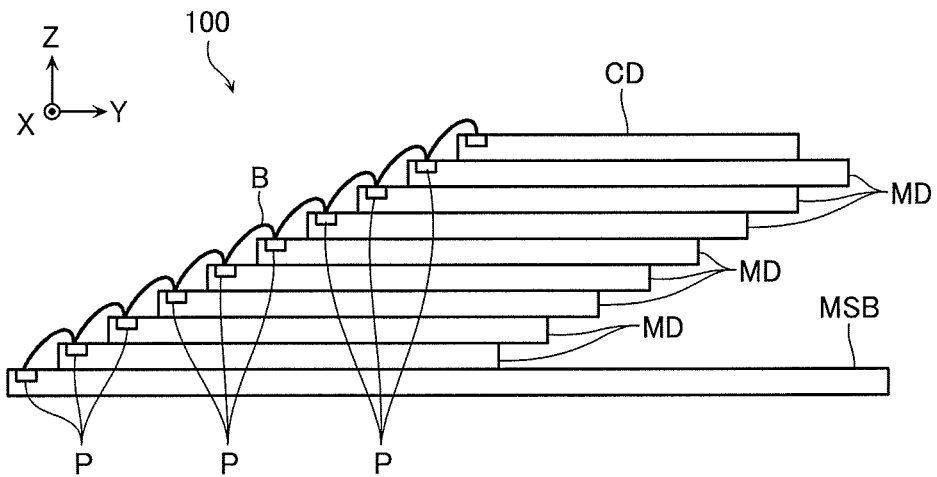
FIG. 2 is a schematic side view showing a configuration example of same memory system 100.
Figure 3:
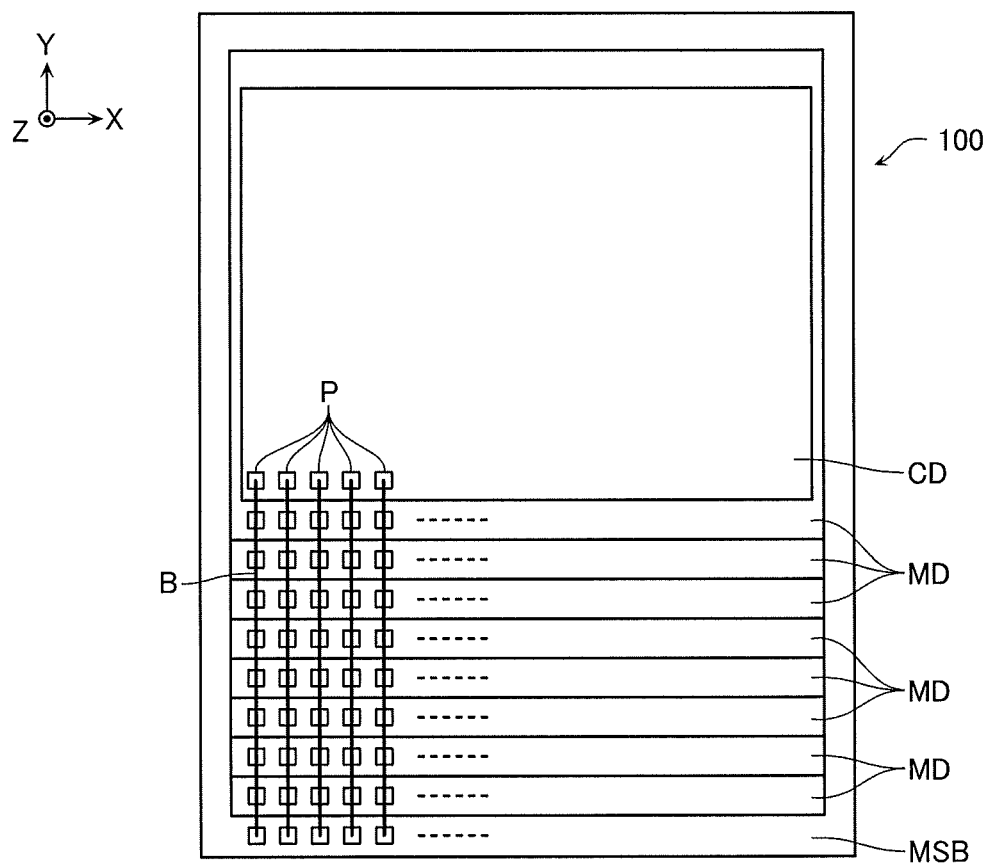
FIG. 3 is a schematic plan view showing same configuration example.

FIG. 2 is a schematic side view showing a configuration example of the memory system 100 according to the present embodiment. FIG. 3 is a schematic plan view showing same configuration example. For convenience of explanation, part of the configuration is omitted in FIGS. 2 and 3.

As shown in FIG. 2, the memory system 100 according to the present embodiment is a memory chip (package) including: a mounting substrate MSB; a plurality of the memory dies MD stacked on the mounting substrate MSB; and the control die CD stacked on the memory dies MD. These configurations are stacked staggered in a Y direction in such a manner that a pad electrode P formed on an upper surface is exposed, and are connected to each other via an adhesive agent or the like.

As shown in FIG. 3, the mounting substrate MSB, the plurality of memory dies MD, and the control die CD each include a plurality of the pad electrodes P. The plurality of pad electrodes P provided in the mounting substrate MSB, the plurality of memory dies MD, and the control die CD are each connected to each other via bonding wires B.

[Memory Die MD]

Figure 4:
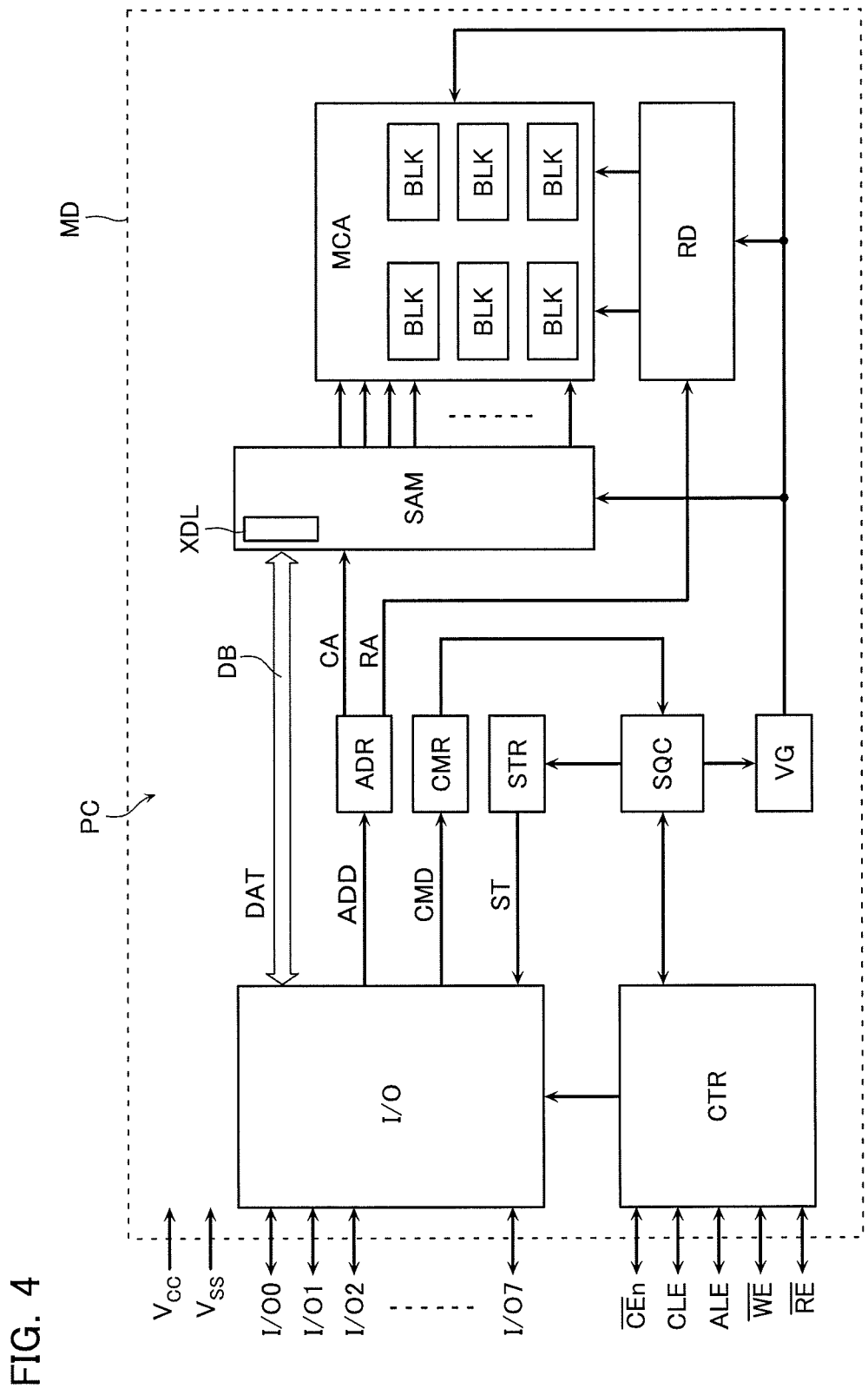
FIG. 4 is a schematic block diagram showing a configuration of a memory die MD according to the first embodiment.
Figure 5:
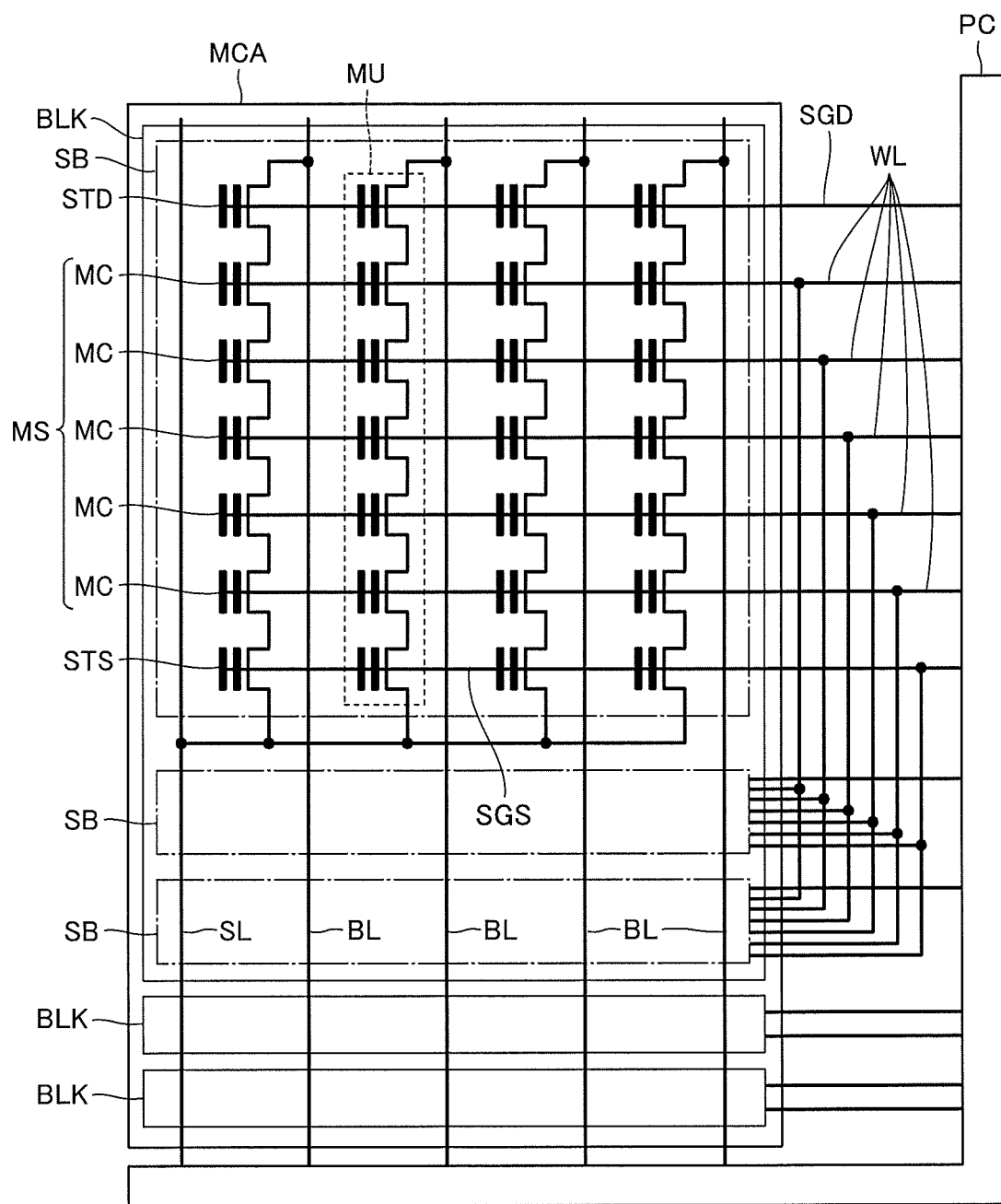
FIG. 5 is a schematic circuit diagram showing a configuration of part of same memory die MD.
Figure 6:
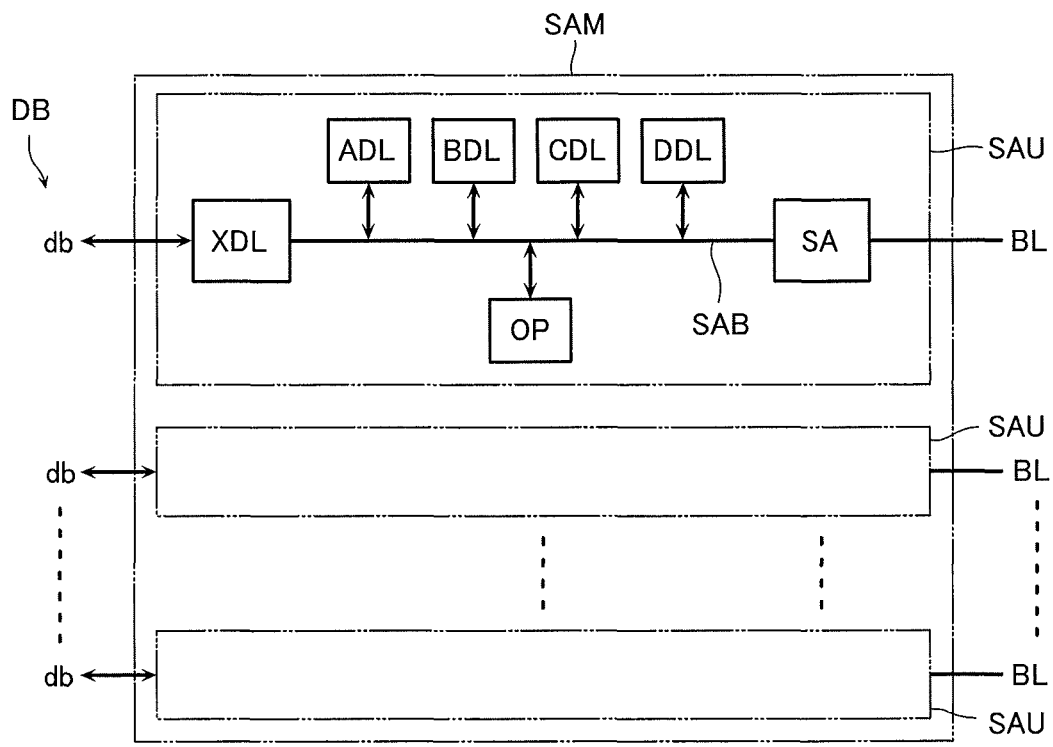
FIG. 6 is a schematic block diagram showing a configuration of part of same memory die MD.

FIG. 4 is a schematic block diagram showing a configuration of the memory die MD according to the first embodiment. FIG. 5 is a schematic circuit diagram showing a configuration of part of the memory die MD. FIG. 6 is a schematic block diagram showing a configuration of part of the memory die MD.

As shown in FIG. 4, the memory die MD includes: a memory cell array MCA storing data; and a peripheral circuit PC connected to the memory cell array MCA.

[Memory Cell Array MCA]

As shown in FIG. 5, the memory cell array MCA includes a plurality of memory blocks BLK. These plurality of memory blocks BLK each include a plurality of sub-blocks SB. These plurality of sub-blocks SB each include a plurality of memory units MU. One ends of these plurality of memory units MU are respectively connected to the peripheral circuit PC via bit lines BL. Moreover, the other ends of these plurality of memory units MU are each connected to the peripheral circuit PC via a common source line SL.

The memory unit MU includes a drain select transistor STD, a memory string MS, and a source select transistor STS that are connected in series between the bit line BL and the source line SL. Hereafter, the drain select transistor STD and the source select transistor STS will sometimes simply be called select transistors (STD, STS).

The memory string MS includes a plurality of memory cells MC connected in series. The memory cell MC according to the present embodiment is a field effect type transistor that includes: a semiconductor layer functioning as a channel region; a gate insulating film including a charge accumulating film; and a gate electrode. A threshold voltage of the memory cell MC changes according to an amount of charge in the charge accumulating film. The memory cell MC stores one bit or multiple bits of data. Note that word lines WL are respectively connected to the gate electrodes of the plurality of memory cells MC corresponding to one memory string MS. These word lines WL are each commonly connected to all of the memory units MU in one memory block BLK.

The select transistor (STD, STS) is a field effect type transistor that includes: a semiconductor layer functioning as a channel region; a gate insulating film; and a gate electrode. Select gate lines (SGD, SGS) are respectively connected to gate electrodes of the select transistors (STD, STS). A drain select line SGD is provided correspondingly to the sub-block SB and is commonly connected to all of the memory units MU in one sub-block SB. A source select line SGS is commonly connected to all of the memory units MU in one memory block BLK.

[Peripheral Circuit PC]

As shown in FIG. 4, the peripheral circuit PC includes a row decoder RD, a sense amplifier module SAM, a voltage generating circuit VG, and a sequencer SQC. In addition, the peripheral circuit PC includes an address register ADR, a command register CMR, and a status register STR. Moreover, the peripheral circuit PC includes an input/output control circuit I/O and a logic circuit CTR.

The row decoder RD includes a decode circuit and a switch circuit, for example. The decode circuit decodes a row address RA latched in the address register ADR. The switch circuit electrically conducts the word lines WL and the select gate lines (SGD, SGS) with corresponding voltage supply lines corresponding to the row address RA, according to an output signal of the decode circuit.

As shown in FIG. 6, the sense amplifier module SAM includes a plurality of sense amplifier units SAU corresponding to a plurality of the bit lines BL. The sense amplifier unit SAU includes: a sense amplifier SA connected to the bit line BL; data latches ADL, BDL, CDL, DDL, XDL; a logic circuit OP; and a wiring SAB connected to these configurations.

The sense amplifier SA includes: a clamp transistor connected to the bit line BL; sense node connected to the clamp transistor; a sense circuit connected to the sense node; a data latch connected to the sense circuit; and a voltage adjusting circuit connected to the data latch. A voltage of the sense node fluctuates according to a current or voltage of the bit line BL. The sense circuit causes data of "H" or "L" indicating ON/OFF of the memory cell MC to be latched in the data latch, according to the voltage of the sense node. The data latch holds the data indicating ON/OFF of the memory cell MC, data indicating necessity/non-necessity of application of a voltage to the bit line BL, or other data. The voltage adjusting circuit electrically conducts the bit line BL with a corresponding voltage supply line, according to data latched in the data latch.

Data included in the data latch in the sense amplifier SA, for example, is appropriately transferred to the data latches ADL, BDL, CDL, DDL. The logic circuit OP performs a logic operation of AND, OR, or the like, on the data in the data latches ADL, BDL, CDL, DDL, and calculates the user data that had been assigned to the memory cell MC.

The data latch XDL is connected to the wiring SAB and a wiring db configuring a bus DB. The data latch XDL has stored therein, for example, user data to be written to the memory cell MC or user data that has been read from the memory cell MC.

Moreover, the sense amplifier module SAM (FIG. 4) includes an unillustrated decode circuit and switch circuit. The decode circuit decodes a column address CA latched in the address register ADR. The switch circuit electrically conducts the data latch XDL with the bus DB corresponding to the column address CA, according to an output signal of the decode circuit.

The voltage generating circuit VG includes, for example, a step-up circuit such as a charge pump circuit connected to a power supply terminal $V_{cc}$ and a ground terminal $V_{ss}$, a step-down circuit such as a regulator, and an unillustrated plurality of voltage supply lines. The voltage generating circuit VG generates multiple types of operation voltages to be applied to the bit lines BL, the source line SL, the word lines WL, and the select gate lines (SGD, SGS) during a read operation, a write operation, and an erase operation on the memory cell array MCA, and outputs the generated operation voltages simultaneously from the plurality of voltage supply lines, according to an internal control signal from the sequencer SQC. Note that the power supply terminal $V_{cc}$ and the ground terminal $V_{ss}$ are achieved by the pad electrodes P described with reference to FIGS. 2 and 3, for example.

The sequencer SQC sequentially decodes command data CMD latched in the command register CMR, and outputs an internal control signal to the row decoder RD, the sense amplifier module SAM, and the voltage generating circuit VG. Moreover, the sequencer SQC outputs to the status register STR status data appropriately indicating its own state.

The input/output control circuit I/O includes: data input/output terminals I/O0-I/O7; a shift register connected to these data input/output terminals I/O0-I/O7; and a buffer memory connected to this shift register. The data input/output terminals I/O0-I/O7 are achieved by the pad electrodes P described with reference to FIGS. 2 and 3, for example. The buffer memory outputs data to the data latch XDL in the sense amplifier module SAM, the address register ADR, or the command register CMR, according to an internal control signal from the logic circuit CTR. Moreover, the buffer memory is inputted with data from the data latch XDL or the status register STR, according to an internal control signal from the logic circuit CTR. Note that the buffer memory may be achieved by part of the above-described shift register, or may be achieved by a configuration such as an SRAM.

The logic circuit CTR receives an external control signal from the control die CD via external control terminals/CEn, CLE, ALE, /WE, /RE, and outputs an internal control signal to the input/output control circuit I/O according to this external control signal. Note that the external control terminals/CEn, CLE, ALE, /WE, /RE are achieved by the pad electrodes P described with reference to FIGS. 2 and 3, for example.

The external control terminal/CEn is employed during selection of the memory die MD. The input/output control circuit I/O of the memory die MD that has had its external control terminal/CEn inputted with "L" performs input/output of data via the data input/output terminals I/O0-I/O7. The input/output control circuit I/O of the memory die MD that has had its external control terminal/CEn inputted with "H" does not perform input/output of data via the data input/output terminals I/O0-I/O7.

Moreover, the external control terminal CLE is employed during use of the command register CMR. When the external control terminal CLE has been inputted with "H", the data inputted via the data input/output terminals I/O0-I/O7 is stored in the buffer memory in the input/output control circuit I/O as the command data CMD, and is transferred to the command register CMR.

Moreover, the external control terminal ALE is employed during use of the address register ADR. When the external control terminal ALE has been inputted with "H", the data inputted via the data input/output terminals I/O0-I/O7 is stored in the buffer memory in the input/output control circuit I/O as address data ADD, and is transferred to the address register ADR.

Note that when both the external control terminals CLE, ALE have been inputted with "L", the data inputted via the data input/output terminals I/O0-I/O7 is stored in the buffer memory in the input/output control circuit I/O as user data DAT, and is transferred to the data latch XDL via the bus DB.

Moreover, the external control terminal/WE is employed during input of data via the data input/output terminals I/O0-I/O7. The data inputted via the data input/output terminals I/O0-I/O7 is fetched into the shift register in the input/output control circuit I/O at a timing of a rise in voltage of the external control terminal/WE (at a timing of switching of an input signal).

Moreover, the external control terminal/RE is employed during output of data via the data input/output terminals I/O0-I/O7. The data outputted from the data input/output terminals I/O0-I/O7 is switched at a timing of a rise in voltage of the external control terminal/RE (at a timing of switching of an input signal).

[Read Operation]

Next, a first read operation and a second read operation of the semiconductor memory device according to the present embodiment will be described. The first read operation is an operation by which user data stored in the memory cell array MCA is transferred to the data latch XDL. The second read operation is an operation by which the user data latched in the data latch XDL is outputted to the control die CD via the data input/output terminals I/O0-I/O7.

[First Read Operation]

Figure 7:
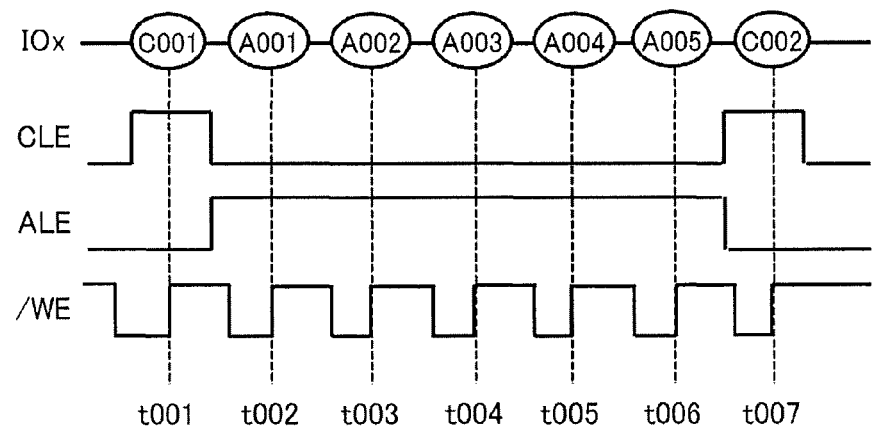
FIG. 7 is a timing chart for explaining a first read operation according to the first embodiment.

FIG. 7 is a timing chart for explaining the first read operation.

FIG. 7 exemplifies a command set inputted during the first read operation. This command set includes data C001, A001, A002, A003, A004, A005, and data C002. Moreover, in FIG. 7, the external control terminal/WE is alternately inputted a plurality of times with "L" and "H".

At timing t001, the control die CD inputs the data C001 as the command data CMD, to the memory die MD. That is, in a state where voltages of the data input/output terminals I/O0-I/O7 have been set to "H" or "L" according to each bit of the data C001, the external control terminal CLE has been inputted with "H", and the external control terminal ALE has been inputted with "L", the control die CD raises the external control terminal/WE from "L" to "H". The data C001 is a command inputted at a time of start of the first read operation.

At timing t002, the control die CD inputs the data A001 as the address data ADD, to the memory die MD. That is, in a state where voltages of the data input/output terminals I/O0-I/O7 have been set to "H" or "L" according to each bit of the data A001, the external control terminal CLE has been inputted with "L", and the external control terminal ALE has been inputted with "H", the control die CD raises the external control terminal/WE from "L" to "H". The data A001 is part of the column address CA.

At timing t003, the control die CD inputs the data A002 as the address data ADD, to the memory die MD. The data A002 is part of the column address CA.

At timing t004, the control die CD inputs the data A003 as the address data ADD, to the memory die MD. The data A003 is part of the row address RA. The data A003 for example includes: a block address specifying the memory block BLK (FIG. 5); and a page address specifying the sub-block SB and the word line WL.

At timing t005, the control die CD inputs the data A004 as the address data ADD, to the memory die MD. The data A004 is part of the row address RA. The data A004 includes, for example, a block address and a page address.

At timing t006, the control die CD inputs the data A005 as the address data ADD, to the memory die MD. The data A005 includes a chip address specifying one memory die MD from the plurality of memory dies MD controlled by the control die CD.

At timing t007, the control die CD inputs the data C002 as the command data CMD, to the memory die MD. The data C002 is a command indicating that input of the command set related to the first read operation has finished.

Next, the sequencer SQC (FIG. 4) inputs an internal control signal to the voltage generating circuit VG. In response, the voltage generating circuit VG generates a voltage required in the read operation.

Next, the sequencer SQC (FIG. 4) transfers the address data ADD latched in the buffer memory in the input/output control circuit I/O, that is, the data A001-A005 to the address register ADR.

Next, the sequencer SQC (FIG. 4) applies an ON voltage to the select gate lines (SGD, SGS) corresponding to the sub-block SB (FIG. 5) specified by the data A001-A005. That is, the sequencer SQC electrically conducts the gate select lines (SGD, SGS) and the voltage supply lines supplying the ON voltage, of the voltage generating circuit VG. Moreover, the sequencer SQC applies a read voltage to the specified word line WL, and applies a read pass voltage to the other word lines WL. The read voltage is a voltage at which the memory cell MC will attain an ON state or an OFF state according to data stored in the memory cell MC. The read pass voltage is a voltage at which the memory cell MC will attain an ON state regardless of data stored in the memory cell MC, and is larger than the read voltage. Moreover, the sequencer SQC applies a read bit line voltage to the bit line BL.

Next, the sequencer SQC (FIG. 4) inputs an internal control signal to the sense amplifier SA (FIG. 6) and acquires data of "H" or "L" indicating ON/OFF of the memory cell MC, according to a voltage or current of the bit line BL. That is, the sequencer SQC causes the bit line BL to be electrically conducted with the sense node of the sense amplifier SA (FIG. 6), and causes the above-described data to be latched in the data latch by the sense circuit.

Note that in such a case as when the memory cell MC stores one bit of data, the data indicating ON/OFF of this memory cell MC and the user data assigned to the memory cell MC may match.

On the other hand, in such a case as when the memory cell MC stores multiple bits of data, the data indicating ON/OFF of the memory cell MC and the user data need not match. In this kind of case, for example, application of the read voltage and acquisition of the data may be performed a plurality of times. In this kind of case, the above-described read voltage increases as the number of times accumulates, for example. Moreover, in this kind of case, the data acquired by the sense amplifier SA is appropriately transferred to the data latches ADL, BDL, CDL, DDL. Moreover, the logic circuit OP performs arithmetic processing on the data in the data latches ADL, BDL, CDL, DDL, and converts into user data the data indicating ON/OFF of the memory cell MC.

Next, the sequencer SQC (FIG. 4) inputs an internal control signal to the sense amplifier module SAM, and transfers the user data to the data latch XDL.

[Second Read Operation]

Figure 8:
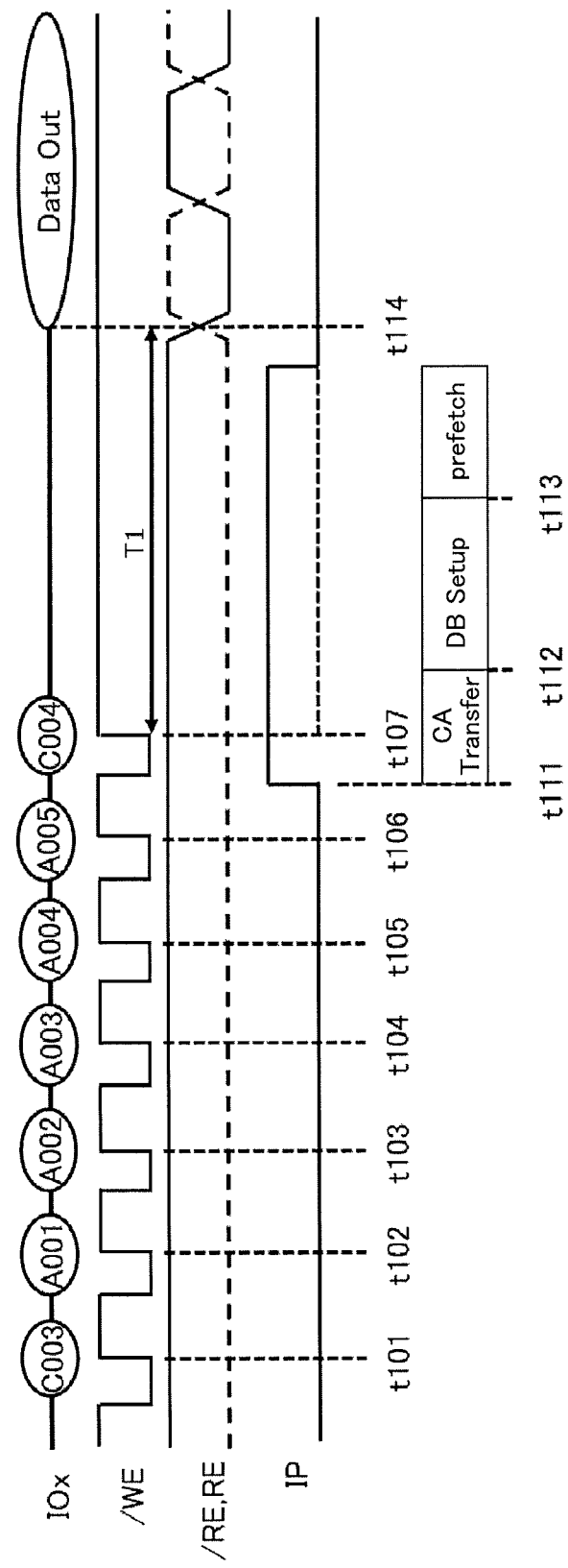
FIG. 8 is a timing chart for explaining a second read operation according to the first embodiment.

FIG. 8 is a timing chart for explaining the second read operation.

FIG. 8 exemplifies a command set inputted during the second read operation. This command set includes data C003, A001, A002, A003, A004, A005, and data C004. Moreover, in FIG. 8, the external control terminal/WE is alternately inputted a plurality of times with "L" and "H".

At timing t101, the control die CD inputs the data C003 as the command data CMD, to the memory die MD. The data C003 is a command inputted at a time of start of the second read operation.

At timing t102, the control die CD inputs the data A001 as the address data ADD, to the memory die MD.

At timing t103, the control die CD inputs the data A002 as the address data ADD, to the memory die MD.

At timing t104, the control die CD inputs the data A003 as the address data ADD, to the memory die MD.

At timing t105, the control die CD inputs the data A004 as the address data ADD, to the memory die MD.

At timing t106, the control die CD inputs the data A005 as the address data ADD, to the memory die MD.

At timing t107, the control die CD inputs the data C004 as the command data CMD, to the memory die MD. The data C004 is a command indicating that input of the command set related to the second read operation has finished.

At timing t111 between timing t106 and timing t107, the sequencer SQC (FIG. 4) performs transfer of the column address CA. That is, a portion corresponding to the column address CA of the address data ADD latched in the buffer memory in the input/output control circuit I/O, that is, the data A001, A002 is transferred to the address register ADR.

At timing t107, the sequencer SQC (FIG. 4) judges whether or not there has been input of the data C004. If the data C004 has been inputted, then the sequencer SQC continues the second read operation, and if the data C004 has not been inputted, the sequencer SQC discontinues the second read operation.

At timing t112, the sequencer SQC (FIG. 4) performs setup of the bus DB. For example, the sequencer SQC performs the likes of a precharge on the plurality of wirings db configuring the bus DB.

At timing t113, the sequencer SQC (FIG. 4) performs a prefetch operation. That is, the sequencer SQC transfers the user data specified by the data A001, A002 to the buffer circuit in the input/output control circuit I/O, via the bus DB.

At timing t114 and thereafter, the control die CD acquires the user data from the memory die MD. That is, the control die CD repeatedly raises the external control terminal/RE from "L" to "H", and reads as the user data a voltage of each terminal of the data input/output terminals I/O0-I/O7.

Note that in the example of FIG. 8, a current IP flowing in the pad electrode P corresponding to the power supply terminal $V_{cc}$ increases at a boundary of timing t111, and decreases at a timing between timing t113 and timing t114. This is because electric power consumed by the memory die MD during transfer of the column address CA, setup of the bus DB, and the prefetch operation that are performed from timing t111 to the above-described timing, is larger than electric power consumed at and before the timing t111 and larger than electric power consumed at and after the above-described timing. Hence, as indicated by the dotted line in FIG. 8, it also sometimes occurs that when, at timing t107, the second read operation has been discontinued without the data C004 being inputted, the current IP decreases at and after timing t107.

Note that, in this embodiment, operations by the memory die MD are performed after the data A005 including the chip address is inputted. In such a case, a current flowing in the pad electrode P corresponding to the voltage source terminal $V_{cc}$ of a memory die MD not corresponding to the address data hardly increases. Therefore, while the transfer of the column address CA, setup of the bus DB, and the prefetch operation are performed, a current IP flowing in an electrode P corresponding to a memory die MD corresponding to the address data is larger than the current flowing in the electrode P corresponding to the memory die MD not corresponding to the address data.

Comparative Example

Figure 9:
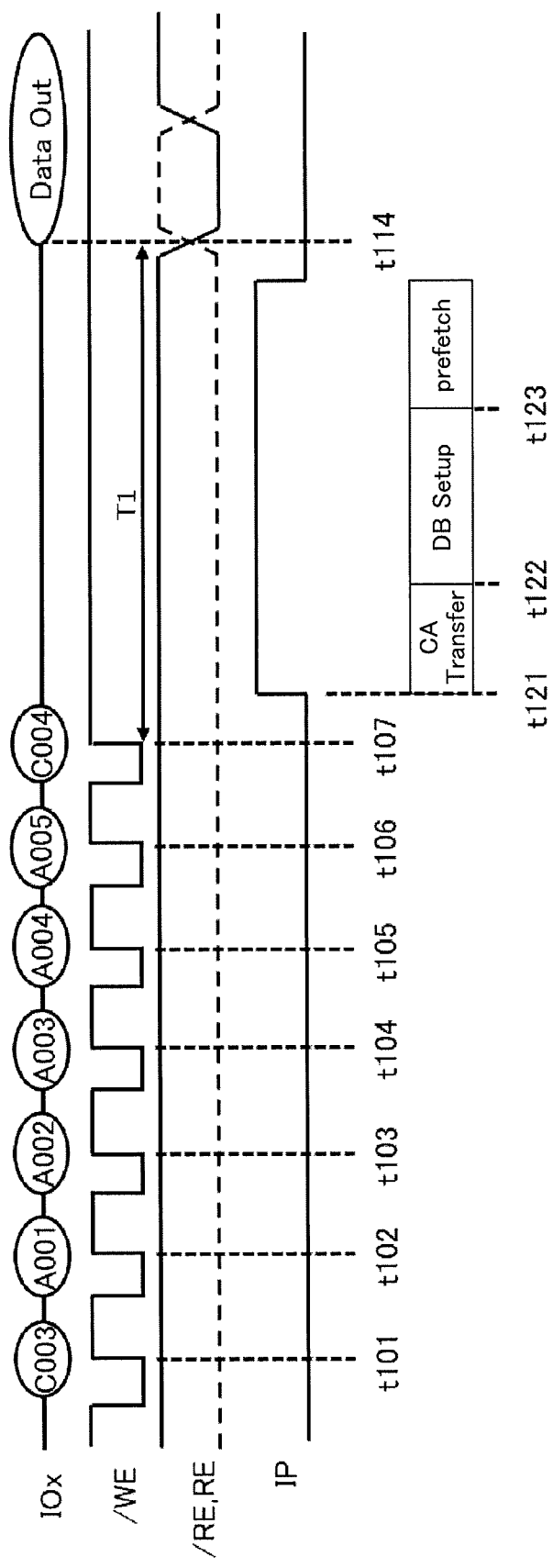
FIG. 9 is a timing chart for explaining a second read operation according to a comparative example.

FIG. 9 is a timing chart for explaining a second read operation according to a comparative example.

The second read operation according to the comparative example is basically performed similarly to that of the first embodiment. However, in the comparative example, transfer of the column address CA is performed at timing t121 after timing t107. Moreover, setup of the bus DB is performed at subsequent timing t122, the prefetch operation is performed at subsequent timing t123, and output of the user data is performed at or after subsequent timing t124. Operations at timings t121, t122, t123, t124 are all performed at later timings compared to in the first embodiment.

[Advantages]

In the semiconductor memory device according to the first embodiment, as described with reference to FIG. 8, operations at timings t111-t114 can be performed at earlier timings than in the comparative example, and a time T1 from timing t107 when the data C004 is inputted to timing t114 when output of the user data is started is smaller than a time T1' from timing t107 to timing t124. That is, it is possible to provide a semiconductor memory device that operates at high speed by reducing a time required for the second read operation.

Second Embodiment

Next, a semiconductor memory device according to a second embodiment will be described with reference to FIG. 10. The semiconductor memory device according to the second embodiment is basically configured similarly to the semiconductor memory device according to the first embodiment, but part of its second read operation differs from that of the first embodiment.

Figure 10:
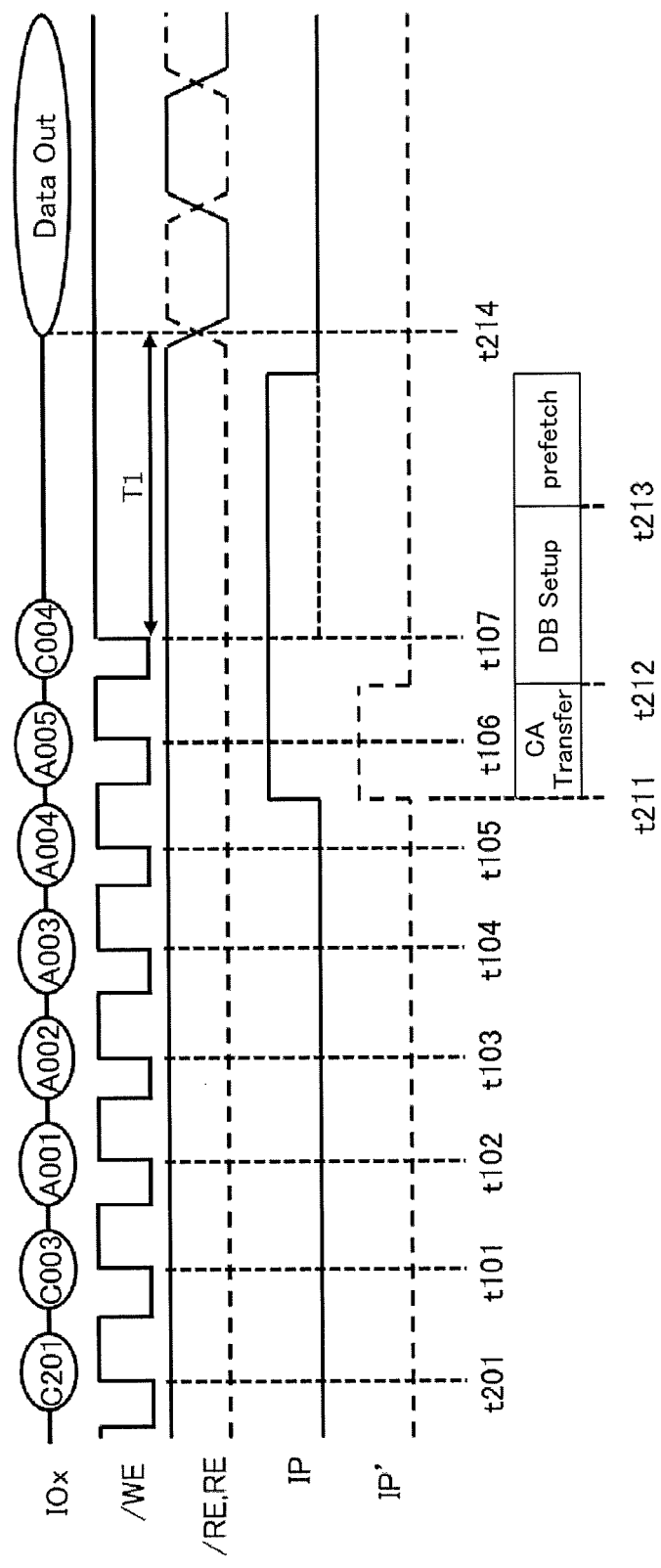
FIG. 10 is a timing chart for explaining a second read operation according to a second embodiment.

FIG. 10 is a timing chart for explaining the second read operation according to the second embodiment. In FIG. 10, portions similar to in FIG. 8 are assigned with the same symbols as in FIG. 8, and descriptions thereof are omitted.

FIG. 10 exemplifies a command set inputted during the second read operation. This command set includes data C201 in addition to the command set exemplified in FIG. 8. The data C201, although being the command data CMD, includes information designating the memory die MD to be used in the second read operation.

At timing t201 prior to timing t101, the control die CD inputs the data C201 as the command data CMD, to the memory die MD.

At timings t101-t107, the control die CD performs similar operations to in the first embodiment.

At timing t211 between timing t105 and timing t106, the sequencer SQC (FIG. 4) performs transfer of the column address CA. Moreover, setup of the bus DB is performed at subsequent timing t212, the prefetch operation is performed at subsequent timing t213, and output of the user data is performed at or after subsequent timing t214. Operations at timings t211, t212, t213, t214 are all performed at earlier timings compared to in the comparative example.

Such a method too makes it possible to provide a semiconductor memory device that operates at high speed by reducing a time required for the second read operation.

Note that in the example of FIG. 10, the current IP flowing in the pad electrode P corresponding to the power supply terminal $V_{cc}$ increases at a boundary of timing t211, and decreases at a timing between timing t213 and timing t214.

Now, in the present embodiment, each of operations by the memory die MD is performed before the data A005 including the chip address is inputted. In such a case, it is considerable that, as indicated by the dotted line in FIG. 10, similar operations end up being performed in an undesignated memory die MD too, a current IP' flowing in the pad electrode P corresponding to the power supply terminal $V_{cc}$ of the undesignated memory die MD ends up increasing, and this leads to an increase in electric power consumption.

Accordingly, in the present embodiment, the memory die MD is designated by input of the data C201, thereby suppressing an increase in electric power consumption in other memory dies MD. Note that, in such a case, similarly to the first embodiment, a current flowing in the pad electrode P corresponding to the voltage source terminal $V_{cc}$ of a memory die MD not corresponding to the address data hardly increases. Therefore, while the transfer of the column address CA, setup of the bus DB, and the prefetch operation are performed, a current IP flowing in an electrode P corresponding to a memory die MD corresponding to the address data is larger than the current flowing in the electrode P corresponding to the memory die MD not corresponding to the address data.

Third Embodiment

Next, a semiconductor memory device according to a third embodiment will be described with reference to FIG. 11. The semiconductor memory device according to the third embodiment is basically configured similarly to the semiconductor memory device according to the second embodiment, but part of its second read operation differs from that of the second embodiment.

Figure 11:
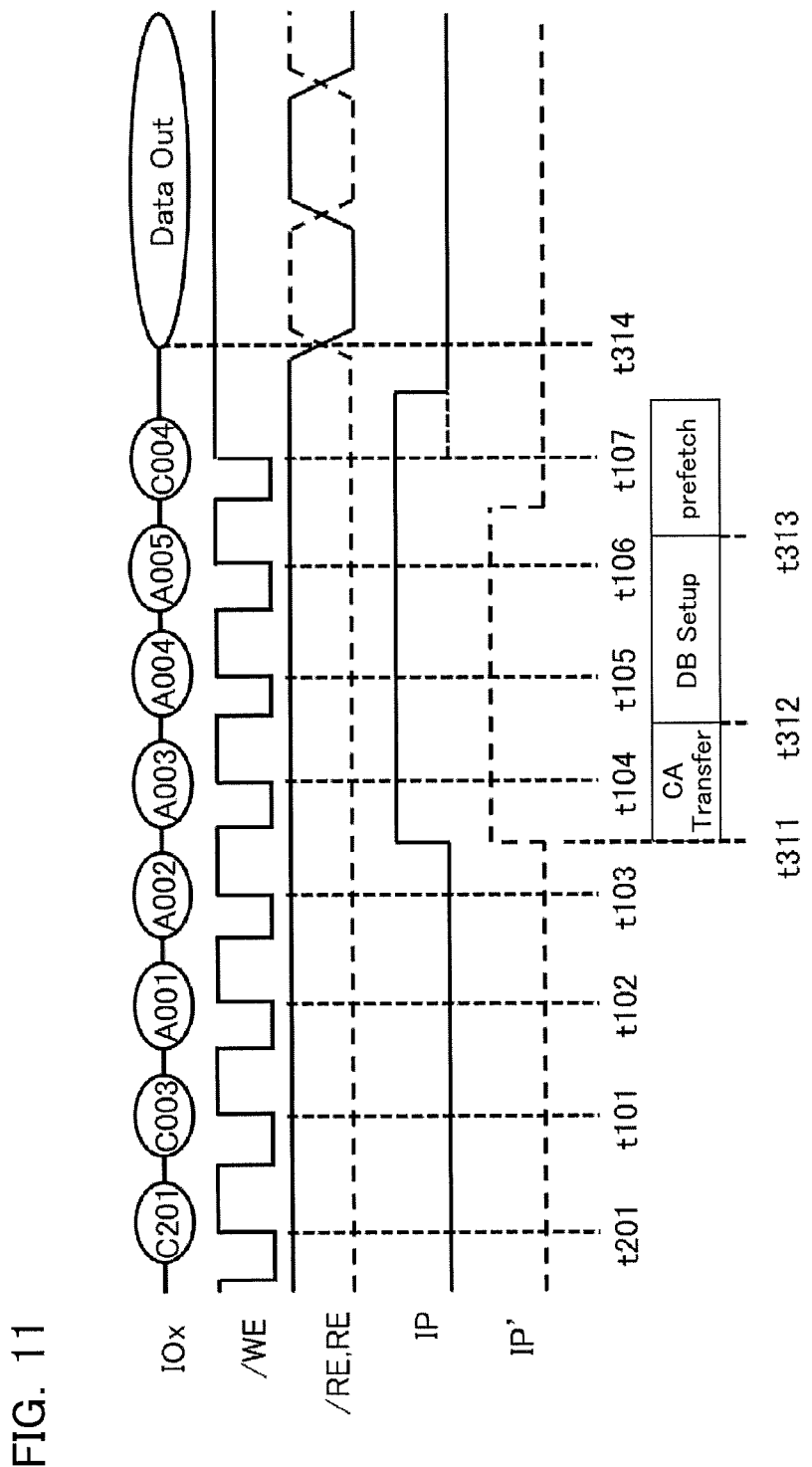
FIG. 11 is a timing chart for explaining a second read operation according to a third embodiment.

FIG. 11 is a timing chart for explaining the second read operation according to the third embodiment. In FIG. 11, portions similar to in FIG. 10 are assigned with the same symbols as in FIG. 10, and descriptions thereof are omitted.

In the second read operation according to the third embodiment, the sequencer SQC (FIG. 4) performs transfer of the column address CA at timing t311 between timing t103 and timing t104. Moreover, setup of the bus DB is performed at subsequent timing t312, the prefetch operation is performed at subsequent timing t313, and output of the user data is performed at or after subsequent timing t314. Operations at timings t311, t312, t313, t314 are all performed at earlier timings compared to in the second embodiment.

Such a method too makes it possible to provide a semiconductor memory device that operates at high speed by reducing a time required for the second read operation. Moreover, an increase in electric power consumption in other memory dies MD can be suppressed similarly to in the second embodiment.

Note that in the example of FIG. 11, the current IP flowing in the pad electrode P corresponding to the power supply terminal $V_{cc}$ increases at a boundary of timing t311, and decreases at a timing between timing t313 and timing t314.

Fourth Embodiment

Next, a semiconductor memory device according to a fourth embodiment will be described with reference to FIG. 12. The semiconductor memory device according to the fourth embodiment is basically configured similarly to the semiconductor memory device according to the second embodiment, but part of its second read operation differs from that of the second embodiment.

Figure 12:
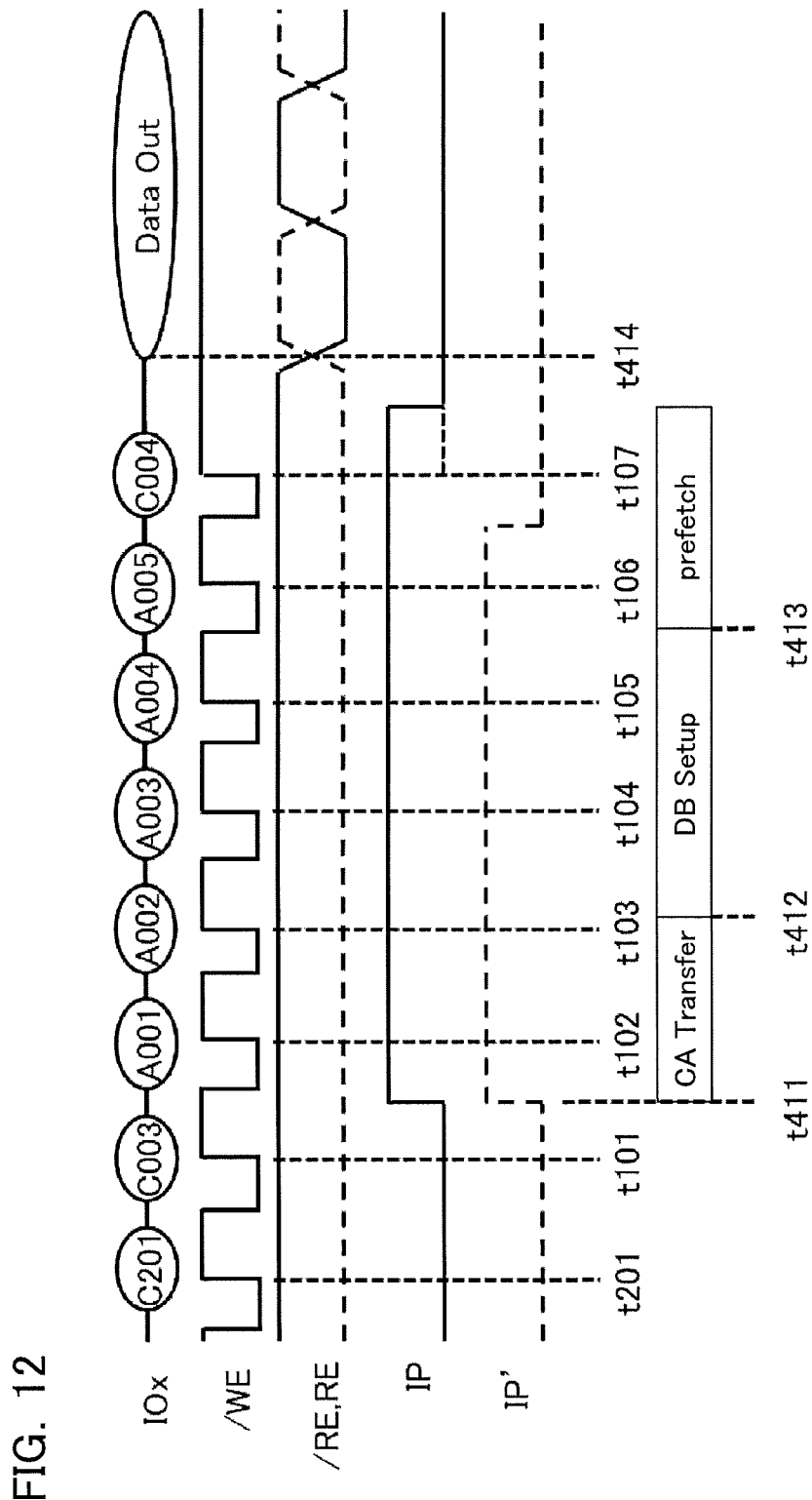
FIG. 12 is a timing chart for explaining a second read operation according to a fourth embodiment.

FIG. 12 is a timing chart for explaining the second read operation according to the fourth embodiment. In FIG. 12, portions similar to in FIG. 10 are assigned with the same symbols as in FIG. 10, and descriptions thereof are omitted.

In the second read operation according to the fourth embodiment, the sequencer SQC (FIG. 4) performs transfer of the column address CA at timing t411 between timing t101 and timing t102. Note that at timing t411, the data A001, A002 corresponding to the column address CA has not yet been inputted. Hence, the sequencer SQC (FIG. 4) transfers a predetermined column address CA.

Moreover, setup of the bus DB is performed at subsequent timing t412, the prefetch operation is performed at subsequent timing t413, and output of the user data is performed at or after subsequent timing t414. Operations at timings t411, t412, t413, t414 are all performed at earlier timings compared to in the second embodiment.

Such a method too makes it possible to provide a semiconductor memory device that operates at high speed by reducing a time required for the second read operation. Moreover, an increase in electric power consumption in other memory dies MD can be suppressed similarly to in the second embodiment.

Note that in the example of FIG. 12, the current IP flowing in the pad electrode P corresponding to the power supply terminal $V_{cc}$ increases at a boundary of timing t411, and decreases at a timing between timing t413 and timing t414.

Fifth Embodiment

Next, a semiconductor memory device according to a fifth embodiment will be described with reference to FIG. 13. The semiconductor memory device according to the fifth embodiment is basically configured similarly to the semiconductor memory device according to the first embodiment, but part of its second read operation differs from that of the first embodiment.

Figure 13:
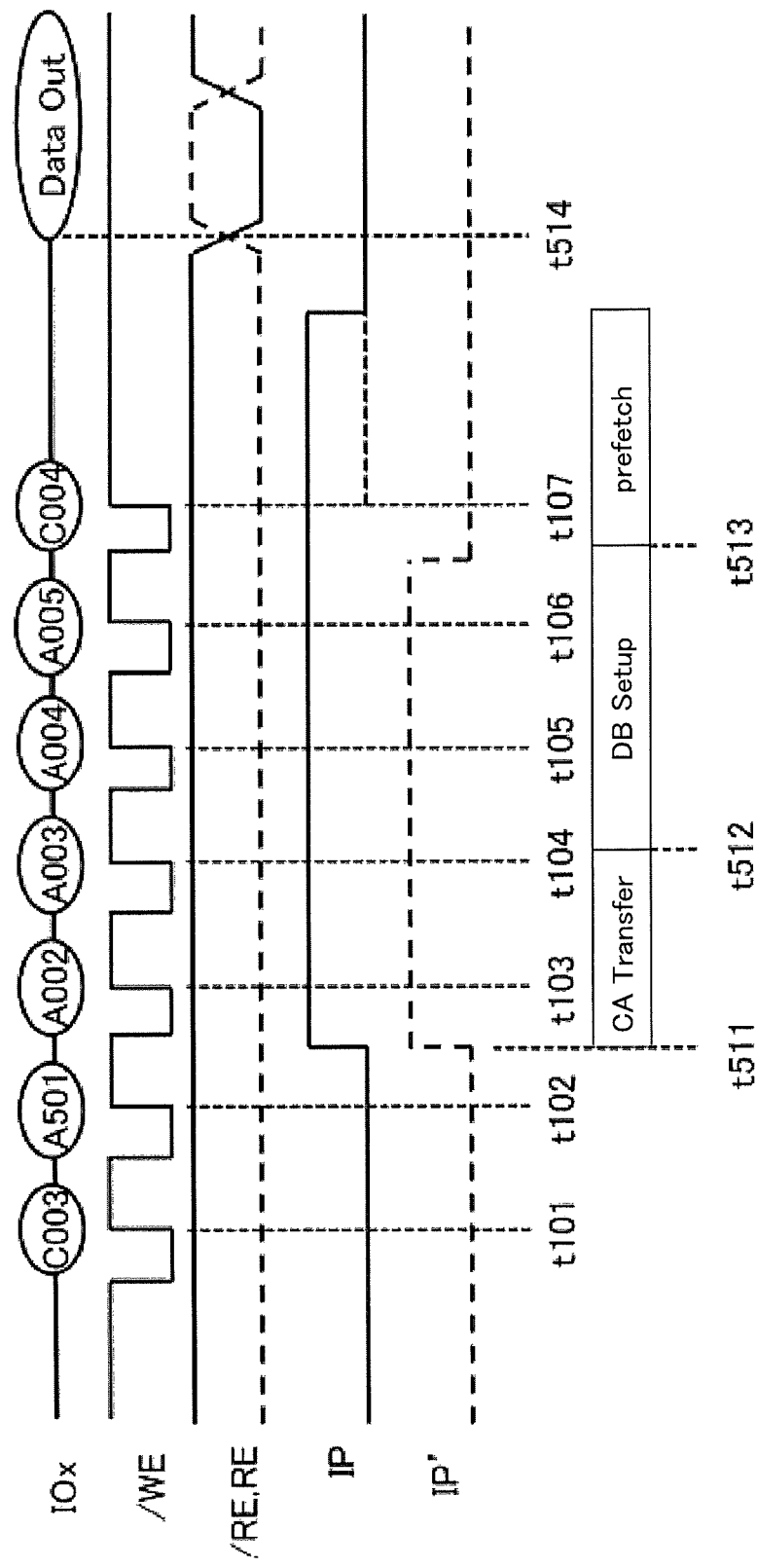
FIG. 13 is a timing chart for explaining a second read operation according to a fifth embodiment.

FIG. 13 is a timing chart for explaining the second read operation according to the fifth embodiment. In FIG. 13, portions similar to in FIG. 8 are assigned with the same symbols as in FIG. 8, and descriptions thereof are omitted.

FIG. 13 exemplifies a command set inputted during the second read operation. This command set is basically similar to the command set exemplified in FIG. 8, but includes data A501 or data A502 instead of the data A001. The data A501 includes data related to the column address CA, a chip address, and a flag bit. The data A502 is substantially similar to the data A001, but includes a flag bit.

At timing t102, the control die CD inputs the data A501 or the data A502 as the address data ADD, to the memory die MD.

In the case that when the data A501 has been inputted at timing t102, for example, the case that a least significant bit of the data inputted at timing t102 is "1", the sequencer SQC (FIG. 4) executes the second read operation as exemplified in FIG. 13.

That is, at timing t511 between timing t102 and timing t103, the sequencer SQC (FIG. 4) performs transfer of the column address CA. For example, the sequencer SQC (FIG. 4) selects one column address CA corresponding to data related to the column address CA included in the data A501, from among predetermined multiple types of column addresses CA, and transfers it to the address register ADR.

Moreover, setup of the bus DB is performed at subsequent timing t512, the prefetch operation is performed at subsequent timing t513, and output of the user data is performed at or after subsequent timing t514.

In the case that when the data A502 has been inputted at timing t102, for example, the case that a least significant bit of the data inputted at timing t102 is "0", the sequencer SQC (FIG. 4) executes the second read operation in a similar mode to in the first embodiment or the comparative example.

Such a method too makes it possible to provide a semiconductor memory device that operates at high speed by reducing a time required for the second read operation. Moreover, specifying the memory die MD by input of the data A501 makes it possible to omit input of the data C201 and thereby further reduce the time required for the second read operation while suppressing an increase in electric power consumption.

Note that in the example of FIG. 13, the current IP flowing in the pad electrode P corresponding to the power supply terminal $V_{cc}$ increases at a boundary of timing t511, and decreases at a timing between timing t513 and timing t514.

Next, the above-described data A501 and data A502 will be described with reference to FIG. 14. FIG. 14 is a view showing configuration examples of the data A501 and the data A502. Note that in FIG. 14, the data A001, A002 are exemplified for comparison.

The data A001 includes, for example, eight bits Col0-Col1 as part of the column address CA. The data A002 includes, for example, five bits Col8-Col12 as part of the column address CA. Hence, the column address CA including the data A001, A002 includes 13 bits of data. Hence, the column address CA is capable of designating 2^13=8192 types of column addresses CA.

The data A501 includes, for example, four bits COL0-COL3 as part of the column address CA. Hence, the data A501 makes it possible to designate 2^4=16 types of column addresses CA. Moreover, the data A501 includes, for example, three bits CHP0-CHP2 as the chip address. Hence, the data A501 makes it possible to designate one memory die MD from 2^3=8 memory dies MD. Moreover, the data A501 includes a flag bit FLG1. The flag bit FLG1 is the least significant bit of the data A501.

The data A502 is basically configured similarly to the data A001, but its least significant bit is configured not as part of the column address CA, but as a flag bit FLG0. In the case of the data A502 having been inputted at above-described timing t102, the data A502 and the data A002 make it possible to designate 2^12=4096 types of column addresses CA.

Now, depending on standards, and so on, of the semiconductor memory device, sometimes, some of the bits of the address data, and so on, are not used. For example, in ToggleDDR2, a least significant bit of the address data corresponding to the data A001 is not used, and selection of odd-numbered bits is not performed. Hence, by using technology of the present embodiment in such a standard, it becomes possible to make effective practical use of the unused bits to perform flexible control that accords with a method of usage. Note that in the example of FIG. 14, the least significant bits of the data A501 and the data A502 are used as flag bits. However, a bit other than the least significant bit may be used as the flag bit, according to a method of usage.

Other Embodiments

The above embodiments are merely exemplifications, and specific modes, and so on, may be appropriately changed.

For example, FIGS. 2 and 3 showed an example where the plurality of memory dies MD and the control die CD were stacked on the mounting substrate MSB, and the pad electrodes P of the mounting substrate MSB, the plurality of memory dies MD, and the control die CD were connected by the bonding wires B. However, the memory dies MD may be stacked on a certain region on the mounting substrate MSB, and the control die CD may be disposed in another region on the mounting substrate MSB. Moreover, the plurality of memory dies MD may be stacked dispersed in multiple places, without all of the memory dies MD being stacked in one place. Moreover, all of the memory dies MD may be provided directly on the mounting substrate MSB. Moreover, the pad electrodes P of the mounting substrate MSB and the plurality of memory dies MD may be connected not by the bonding wires B, but by another electrode or wiring, and so on. For example, they may be connected by an electrode of the likes of a so-called TSV (Through Silicon Via) electrode, that penetrates a substrate, or the like, of the memory die MD.

Moreover, for example, FIG. 4 showed the external control terminals/CEn, CLE, ALE, /WE, /RE. Now, the symbol "/" related to these external control terminals indicates that an inputted signal is an inverted signal. The external control terminal may have its configuration changed from one inputted with an inverted signal to one inputted with a non-inverted signal, or may have its configuration changed from one inputted with a non-inverted signal to one inputted with an inverted signal. In this case, at least one of the above-described external control terminals may be substituted by CEn, /CLE, /ALE, WE, RE. For example, as exemplified by the dotted lines in FIGS. 8-13, a signal inputted to the external control terminal/RE is an inverse of a signal inputted to the external control terminal RE.

Additionally, for example, in the above-mentioned embodiments, the data inputted via the data input/output terminals I/O0-I/O7 is fetched into the shift register in the input/output control circuit I/O at a timing of a rise in voltage of the external control terminal/WE. However, the data inputted via the data input/output terminals I/O0-I/O7 may be fetched into the shift register in the input/output control circuit I/O at a timing of a fall in voltage of the external control terminal/WE. Similarly, in the above-mentioned embodiments, the data outputted from the data input/output terminals I/O0-I/O7 is switched at a timing of a rise in voltage of the external control terminal/RE. However, the data outputted from the data input/output terminals I/O0-I/O7 may be switched at a timing of a fall in voltage of the external control terminal/RE.

Moreover, as shown in FIGS. 10-12, in the second through fourth embodiments, the control die CD inputted the data C201 as the command data CMD, to the memory die MD, at timing t201. However, in these embodiments, input of the data C201 may be omitted. In this case, as shown in FIGS. 10-12, the current IP' flowing in the pad electrode P increases at a boundary of timings t211, t311, t411 not only in the memory die MD that is a target of the second read operation, but also in the other memory dies MD. It is possible for this current IP' to be reduced at or after timing t106 when the data A005 including the chip address is inputted. Such a method makes it possible for input of the data C201 to be omitted, thereby further reducing the time required for the second read operation.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including a plurality of memory cells;
a peripheral circuit connected to the memory cell array, the peripheral circuit outputting data stored in the memory cell array as a read data in response to input of a command set, the command set including a first command, address data inputted after an input of the first command, and a second command inputted after an input of the address data;
a first electrode capable of being used in input of the command set and output of the read data; and
a second electrode capable of supplying electric power to the peripheral circuit,
a current flowing in the second electrode at a second timing being larger than a current flowing in the second electrode at a first timing, the first timing being a timing at which the first command is inputted, the second timing being a timing before which the input of the address data is started and after which an input of the second command is finished.

2. The semiconductor memory device according to claim 1, wherein
the second timing is a certain timing after the input of the address data is finished and before the input of the second command is finished.

3. The semiconductor memory device according to claim 1, wherein
the second timing is a certain timing after the input of the address data is started and before the input of the address data is finished.

4. The semiconductor memory device according to claim 1, wherein
assuming that:
a first average value is an average value of a current flowing in the second electrode after the input of the first command is finished and before the input of the address data is started; and
a second average value is an average value of a current flowing in the second electrode after the input of the address data is finished and before the input of the second command is started,
the second average value is larger than the first average value.

5. A semiconductor memory device, comprising:
a memory cell array including a plurality of memory cells;
a peripheral circuit connected to the memory cell array, the peripheral circuit outputting data stored in the memory cell array as a read data in response to input of a command set, the command set including a first command, address data inputted after an input of the first command and including a flag information, and a second command inputted after an input of the address data;
a first electrode capable of being used in input of the command set and output of the read data; and
a second electrode capable of supplying electric power to the peripheral circuit,
in case that the flag information is a first value,
a first current flowing in the second electrode at a first timing at which the first command is inputted,
a second current flowing in the second electrode at a second timing before which the input of the first command is finished and after which an input of the second command is finished, and
a third current flowing in the second electrode at a third timing before which the input of the second command is finished,
in case that the flag information is a second value,
a fourth current flowing in the second electrode at the first timing,
a fifth current flowing in the second electrode at the second timing, and
a sixth current flowing in the second electrode at the third timing, and
the third current, the fifth current, and the sixth current being larger than the first current, the second current, and the fourth current.

6. The semiconductor memory device according to claim 5,
comprising a data bus through which the read data is transferred,
in case that the flag information is the first value, a setup of the data bus is started after the input of the second command is finished,
in case that the flag information is the second value, the setup of the data bus is started before the input of the second command is finished.

7. A memory system comprising a plurality of memory chips,
each of the plurality of memory chips comprising:
a memory cell array including a plurality of memory cells;
a peripheral circuit connected to the memory cell array, the peripheral circuit outputting data stored in the memory cell array as a read data in response to input of a command set, the command set including a first command, address data inputted after an input of the first command and including a flag information, and a second command inputted after an input of the address data;
a first electrode capable of being used in input of the command set and output of the read data; and
a second electrode capable of supplying electric power to the peripheral circuit,
the plurality of memory chips including a first memory chip and a second memory chip,
at a first timing at which the first command is inputted to the first memory chip and the second memory chip, a first current flowing in the second electrode of the first memory chip, and a second current flowing in the second electrode of the second memory chip,
at a second timing before which the input of the address data is started and after which the input of the address data is finished, a third current flowing in the second electrode of the first memory chip, and a fourth current flowing in the second electrode of the second memory chip,
at a third timing before which the input of the address data is finished and after which the input of the second command is started, a fifth current flowing in the second electrode of the first memory chip, and a sixth current flowing in the second electrode of the second memory chip,
the third current, the fourth current, and the fifth current being larger than the first current, the second current, and the sixth current.

* * * * *